United States Patent
Kong et al.

(10) Patent No.: US 8,527,797 B2
(45) Date of Patent: Sep. 3, 2013

(54) SYSTEM AND METHOD OF LEAKAGE CONTROL IN AN ASYNCHRONOUS SYSTEM

(75) Inventors: Xiaohua Kong, Irvine, CA (US); Lew G. Chua-Eoan, Carlsbad, CA (US); Sei Seung Yoon, San Diego, CA (US); Zhi Zhu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 1487 days.

(21) Appl. No.: 11/964,072

(22) Filed: Dec. 26, 2007

(65) Prior Publication Data

US 2009/0172452 A1 Jul. 2, 2009

(51) Int. Cl.
*G06F 1/32* (2006.01)
(52) U.S. Cl.
USPC ............ 713/324; 713/300; 713/320; 713/323
(58) Field of Classification Search
USPC .................................. 713/300, 320, 323, 324
See application file for complete search history.

(56) References Cited

U.S. PATENT DOCUMENTS

| | | | |
|---|---|---|---|
| 5,710,910 A | 1/1998 | Kehl et al. | |
| 6,140,836 A | 10/2000 | Fujii et al. | |
| 6,208,171 B1 * | 3/2001 | Kumagai et al. | 326/121 |
| 6,486,709 B2 | 11/2002 | Sutherland et al. | |
| 6,975,655 B2 | 12/2005 | Fischer et al. | |
| 7,511,535 B2 * | 3/2009 | Chakraborty et al. | 326/93 |
| 2001/0056552 A1 * | 12/2001 | Cook et al. | 713/500 |
| 2003/0076172 A1 * | 4/2003 | Tichauer | 330/285 |
| 2003/0131271 A1 * | 7/2003 | Chen et al. | 713/322 |
| 2003/0133337 A1 * | 7/2003 | Yamada et al. | 365/200 |
| 2004/0068640 A1 * | 4/2004 | Jacobson et al. | 712/220 |
| 2005/0083081 A1 * | 4/2005 | Jacobson et al. | 326/93 |
| 2006/0059376 A1 | 3/2006 | Ngo et al. | |

FOREIGN PATENT DOCUMENTS

| | | |
|---|---|---|
| GB | 2310738 | 9/1997 |
| JP | 09244890 | 9/1997 |
| JP | 10247394 A | 9/1998 |
| JP | 2003344506 A | 12/2003 |
| JP | 2004526241 A | 8/2004 |

OTHER PUBLICATIONS

International Search Report and Written Opinion—PCT/US2008/088322, International Search Authority—European Patent Office—Jul. 14, 2009.

* cited by examiner

*Primary Examiner* — Paul Yanchus, III
(74) *Attorney, Agent, or Firm* — Nicholas J. Pauley; Sam Talpalatsky; Joseph Agusta

(57) ABSTRACT

Systems and methods of leakage control in an asynchronous pipeline are disclosed. In an embodiment, a signal is received from a preceding stage at an operative stage of an asynchronous circuit device, and a switch associated with the operative stage is activated in response to the control signal being sent to the operative stage to enable power to the operative stage.

20 Claims, 5 Drawing Sheets

SYSTEM AND METHOD OF LEAKAGE CONTROL IN AN ASYNCHRONOUS SYSTEM

I. FIELD

The present disclosure is generally related to a system and method of leakage control in an asynchronous system.

II. DESCRIPTION OF RELATED ART

Advances in technology have resulted in smaller and more powerful personal computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and IP telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application, that can be used to access the Internet. As such, these wireless telephones can include significant computing capabilities.

Such portable devices may include electronic components that are only used intermittently and not continuously. However, electronic components consume power even when not actively in use, such as leakage currents due to properties of transistors and other components. Although some electronic components have been proposed that include a switch to reduce power by decoupling the component from a positive voltage source (a head switch) or a ground (a foot switch) using state logic coupled to a system clock, such components have limited application due to the dynamic clock power consumption required for each component.

III. SUMMARY

In a particular embodiment, a system is disclosed. The system includes a first asynchronous logic stage and a second asynchronous logic stage. The second asynchronous logic stage includes a terminal coupled to a power supply via a switch. The switch is selectively activated in response to a control signal being sent from a predecessor asynchronous logic stage to the second asynchronous logic stage to enable power to the second asynchronous logic stage.

In another particular embodiment, a method is disclosed that includes receiving a control signal from a preceding stage at an operative stage of an asynchronous circuit device. The method also includes activating a switch associated with the operative stage in response to the control signal being sent to the operative stage to enable power to the operative stage.

In another particular embodiment, a method is disclosed that includes receiving a control signal from a subsequent stage at an operative stage of an asynchronous circuit device. The method also includes deactivating a switch associated with the operative stage in response to the control signal being sent to the operative stage to deactivate power to the operative stage.

In another particular embodiment, a system is disclosed that includes first means to perform a first pipeline operation. The system also includes second means to asynchronously perform a second pipeline operation that is sequential to the first pipeline operation. The system further includes means to selectively decouple the second means from a power supply in response to a state of the first pipeline operation.

In another particular embodiment, a system is disclosed that includes a processing stage of an asynchronous processing pipeline. The system also includes a control circuit configured to selectively couple the processing stage to a power supply in response to a state of the asynchronous processing pipeline.

A particular advantage provided by the disclosed embodiments is reduced power consumption due to lower leakage current by powering off unused circuit elements at a high degree of granularity. Individual stages of an asynchronous pipeline may be selectively decoupled from a power supply without an offsetting increase in dynamic clock power consumption.

Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

V. DETAILED DESCRIPTION

Figure 1:
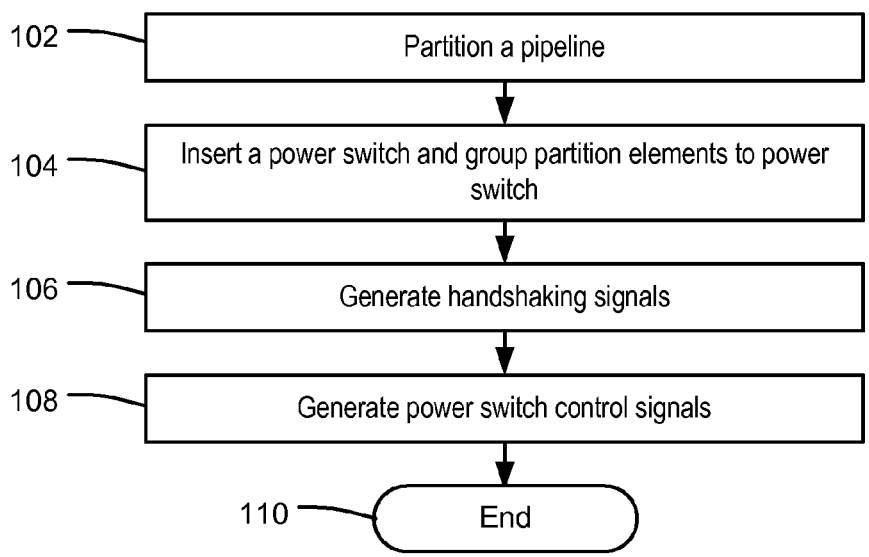
FIG. 1 is a flow diagram of a particular illustrative embodiment of a method of leakage control in an asynchronous system.

Referring to FIG. 1, a particular illustrative embodiment of a method of leakage control in an asynchronous system is depicted. At 102, a pipeline is partitioned. The pipeline may be a processing pipeline of a digital system. In an illustrative embodiment, the pipeline includes at least two logical stages that may be executed serially. For example, a state of a predecessor stage of the pipeline may affect an outcome of a successor stage of the pipeline.

Advancing to 104, a power switch is inserted and partition elements are grouped to the power switch. Partition elements may include circuit devices and logic coupled to the power switch, such as circuit devices coupled to a system ground via a foot switch or coupled to a supply voltage via a head switch.

Moving to 106, handshaking signals are generated. In a particular embodiment, handshaking signals are generated by and exchanged between two or more control logic circuits along the pipeline. For example, each stage of the pipeline may include a control logic circuit configured to generate a request signal to a subsequent stage indicating that an operation at the present stage is complete. The control logic circuit may further be configured to receive an acknowledgment signal or a data consumed signal from the subsequent stage when processing has completed at the subsequent stage. In a particular embodiment, the handshaking signals are generated and exchanged independent of a system clock signal for asynchronous operation.

Continuing to 108, power switch control signals are generated. In a particular embodiment, power switch control signals may be generated by one or more control logic circuits coupled to each stage of the pipeline. The power switch control signals may direct each pipeline stage to be selectively coupled to or decoupled from a power supply. Thus, in a particular embodiment, a processing pipeline is partitioned and asynchronously processed in a stage-by-stage manner so that stages that are not currently in use are decoupled from a power supply to reduce a leakage current associated with the stages. However, stages that are supplying data to a stage that is in use or that are awaiting data from a stage that in use may remain coupled to the power supply.

In a particular embodiment, the method may be performed by any asynchronous system or device using handshaking signals to control data flow through multiple stages. For example, the method may be performed at an asynchronous bus or bus controller; a pipelined analog-to-digital converter (A/D); a pipelined processor execution unit; a digital, audio, or graphics processing unit; other pipelined or sequential processing devices, or any combination thereof. Further, the method may be performed at multiple devices or components exchanging data in an asynchronous manner. For example, each of a wireless transceiver, a modem, a bus, and a processor may be a single stage of an asynchronous pipeline. Alternatively, greater power savings may be achieved by partitioning one or more of the transceiver, modem, bus, and processor into multiple pipeline partitions, each of which may be independently decoupled from one or more power supplies to reduce active leakage currents.

In a particular embodiment, existing devices and systems using asynchronous processing or data transfer may be retrofitted to reduce leakage current without introducing significant pipeline scheduling control logic or dynamic clock power consumption. Handshaking signals already in use between existing stages may be used to selectively couple or decouple the individual stages to a power supply by directly supplying the handshaking signals to a switching element, by generating switching control signals based on received handshaking signals, or any combination thereof.

Figure 2:
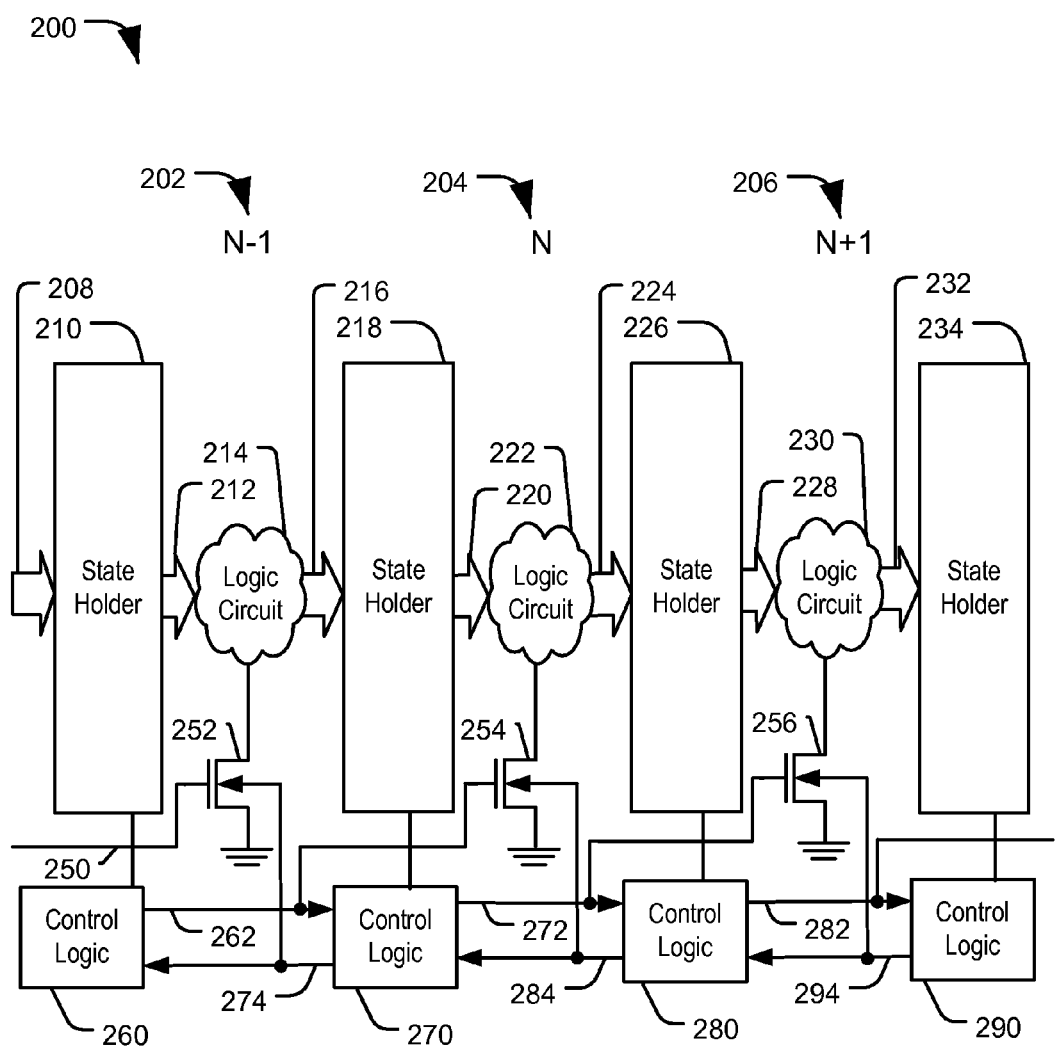
FIG. 2 is a block diagram of a particular illustrative embodiment of a system to control leakage in an asynchronous pipeline.

Referring to FIG. 2, a particular illustrative embodiment of a system to control leakage in an asynchronous pipeline is depicted and generally designated 200. The system 200 includes three representative successive pipeline stages, including an N−1 stage 202, an N stage 204, and an N+1 stage 206. An input signal 208 is provided to a first state holder 210. The N−1 stage 202 is configured to receive an input signal 212 from the first state holder 210 at a logic circuit 214. The logic circuit 214 is configured to provide an output signal 216 to a second state holder 218. The N stage 204 is configured to receive an input signal 220 from the second state holder 218 at a logic circuit 222. The logic circuit 222 is coupled to provide an output signal 224 to a third state holder 226. The N+1 stage 206 is configured to receive an input 228 from the third state holder 226 at a logic circuit 230, and to provide an output signal 232 to a fourth state holder 234. The state holders 210, 218, 226, and 234 may include latches, flip flops, other data storage devices, or any combination thereof.

In a particular embodiment, the logic circuit 214 of the N−1 stage 202 is selectively coupled to a power supply via a switch, such as the foot switch 252 that is coupled to a ground and that receives an input 250 at a gate terminal. Similarly, the logic circuit 222 of the N stage 204 is coupled to a power supply via a switch 254, and the logic circuit 230 of the N+1 stage 206 is coupled to a power supply via a switch 256.

A first control logic circuit 260 is coupled to the first state holder 210, a second control logic circuit 270 is coupled to the second state holder 218, a third control logic circuit 280 is coupled to the third state holder 226, and a fourth control logic circuit 290 is coupled to the fourth state holder 234. Each of the control logic circuits 260, 270, 280, and 290 are configured to generate, send, and receive handshaking signals to control asynchronous processing of the pipeline stages 202, 204, and 206. In a particular embodiment, each control logic circuit 260, 270, 280, and 290 is adapted to provide a request (REQ) signal to a subsequent control logic circuit and to provide an acknowledgement (ACK) signal to a preceding control logic circuit. In addition, in a particular embodiment, each control logic circuit 260, 270, 280, and 290 is adapted to receive a request (REQ) signal from a preceding control logic circuit and to receive an acknowledgement (ACK) signal from a subsequent control logic circuit. In a particular embodiment, each of the stages 202, 204, and 206 may operate as asynchronous logic stages of an asynchronous processing pipeline.

Each of the switches 252, 254, and 256 is coupled to receive control signals indicating a state of the processing pipeline, including a state of a previous stage, a state of a current stage, or a state of a subsequent stage, or any combination thereof. For example, the second control switch 254 is illustrated as a transistor that is adapted to selectively couple or decouple the logic circuit 222 of the N stage 204 to ground in response to a REQ signal 262 received at a gate terminal of the transistor from the first control logic circuit 260 and further in response to an ACK signal 284 received at a body or bulk terminal from the third control logic circuit 280. Thus, depending on a state of a previous stage (e.g., the N−1 stage 202), a state of a subsequent stage (e.g., the N+1 stage 206), and a state of a current stage (e.g., the N stage 204), the logic circuit of each stage can coupled to ground to enable processing, or decoupled from ground when processing is complete. In addition, the logic circuit of each stage can be decoupled from ground when data is not available from the previous stage, when data is not required to be provided to the subsequent stage, or any combination thereof.

In a particular embodiment, an illustrative operation of the system 200 begins with each of the logic circuits 214, 222, and 230 decoupled from ground via the respective switches 252, 254, and 256 (e.g., each signal 262, 272, and 282 is "0" and each signal 274, 284, and 294 is "0"), when the input signal 208 is received at the first state holder 210 and held via one or more latches or flip flops. A handshaking signal from an N−2 stage (i.e., preceding the N−1 stage 202) (not shown) may indicate that valid data is stored at the first state holder 210 for consumption at the N−1 stage 202. In a particular embodiment, the handshaking signal is a "1" signal that activates the switch 252, creating an electrical path between a terminal coupled to the logic circuit 214 and a terminal coupled to ground, and powering on the logic circuit 214 of the N−1 stage 202.

When processing is complete at the logic circuit 214 of the N−1 stage 202, a REQ signal 262 (e.g., a "1") is sent to the second control logic circuit 270 and the output of the logic circuit 214 is stored at the second state holder 218. In addition, the REQ signal 262 is also sent to the switch 254, powering on the logic circuit 222 of the N stage 204.

When processing is complete at the logic circuit 222 of the N stage 204, a REQ signal 272 is sent to the third control logic circuit 280 and the output of the logic circuit 222 is stored at the third state holder 226. The REQ signal 272 is also sent to the switch 256, and an ACK signal 274 (e.g., a "1") is sent to the first control circuit 260. The REQ signal 272 activates the switch 256, powering on the logic circuit 230 of the N+1 stage 206. The ACK signal 274 deactivates the switch 252, powering off the logic circuit 214 of the N−1 stage 202.

When processing is complete at the logic circuit 230 of the N+1 stage 206, a REQ signal 282 is sent to the fourth control logic circuit 290 and the output of the logic circuit 230 is stored at the fourth state holder 234. An ACK signal 284 is sent to the second control circuit 270. The ACK signal 284 deactivates the switch 254, powering off the logic circuit 222 of the N stage 204.

When data stored at the fourth state holder 234 is no longer needed, such as when a subsequent N+2 stage (not shown) has completed operations, the fourth control logic circuit 290 sends an ACK signal 294 to the third control circuit 280. The ACK signal 294 deactivates the switch 256, powering off the logic circuit 230 of the N+1 stage 206.

Thus, each logic circuit may be sequentially powered on when valid input data is provided by a previous stage, and powered off when a subsequent stage has completed processing of output data. In a particular embodiment, each stage remains powered off until the subsequent stage has completed processing. For example, the switch 254 may be turned on by the REQ signal 262, and turned off by the ACK signal 284. The switch 254 will remain off while the ACK signal 284 continues, even if another REQ signal 262 is received. As a result, each stage may remain powered off until both prior stage and a subsequent stage are in a ready condition.

In another embodiment, the system 200 may include a first asynchronous logic stage, such as the N−1 stage 202, and a second asynchronous logic stage including a terminal coupled to a power supply via a switch, such as the N stage 204. The switch is selectively activated in response to a control signal being sent from a predecessor asynchronous logic stage to the second asynchronous logic stage to enable power to the second asynchronous logic stage. As illustrated in FIG. 2, the predecessor asynchronous logic stage includes the first asynchronous logic stage (the N−1 stage 202). In another embodiment, the predecessor asynchronous logic stage includes a device other than the first asynchronous logic stage. For example, the predecessor logic circuit may include a bus, modem, or circuit device (not shown) other than the N−1 stage 202 that provides a control signal to selectively power on or power off the N stage 204.

Figure 3:
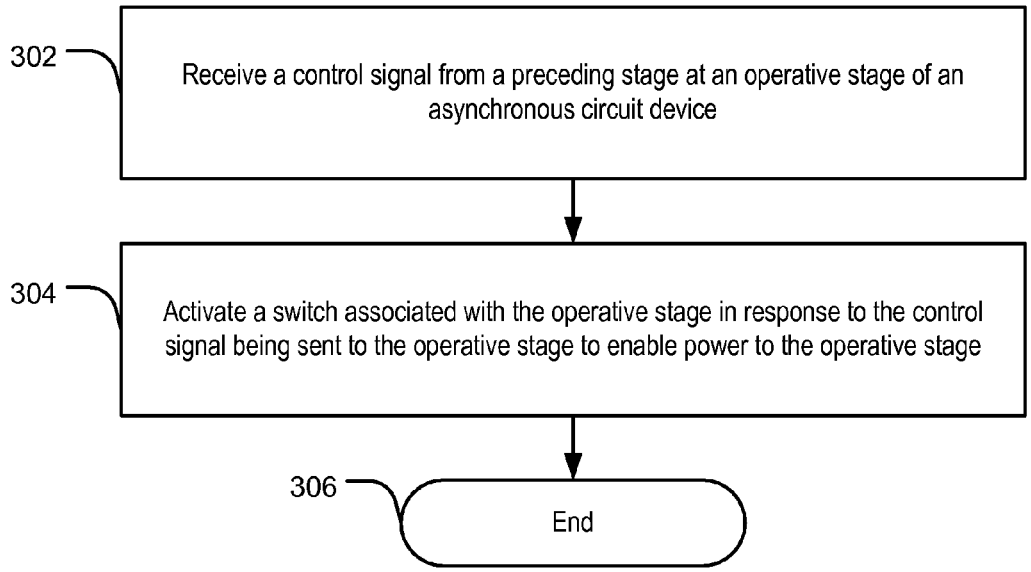
FIG. 3 is a flow diagram of a second illustrative embodiment of a method of leakage control in an asynchronous system.

Referring to FIG. 3, a second illustrative embodiment of a method of leakage control in an asynchronous system is depicted. At 302, a control signal is received from a preceding stage at an operative stage of an asynchronous circuit device. The operative stage may include a latch device, a flip flop device, a logic device, or any combination thereof. In an illustrative embodiment, the control signal may be received at a control logic circuit, such as the request signal 262 that is received at the second control logic circuit 270 as illustrated in FIG. 2.

In a particular embodiment, the control signal includes a request signal, a data validity signal, or any combination thereof. For example, the control signal may be responsive to a data valid condition that indicates a completion of a data operation at the preceding stage. In an illustrative embodiment, the asynchronous circuit device includes a processor having a multistage pipeline, and the preceding stage and the operative stage are sequential stages of the multistage pipeline.

Moving to 304, a switch associated with the operative stage is activated in response to the control signal being sent to the operative stage to enable power to the operative stage. The switch may include one or more transistors. In a particular embodiment, the switch is a head switch or a foot switch.

In addition to receiving the request signal, in a particular embodiment, an acknowledge signal from a subsequent stage of the asynchronous circuit device may also be received before the switch is activated. The acknowledge signal may be responsive to a completion of a data operation at the subsequent stage. The method terminates at 306.

Figure 4:
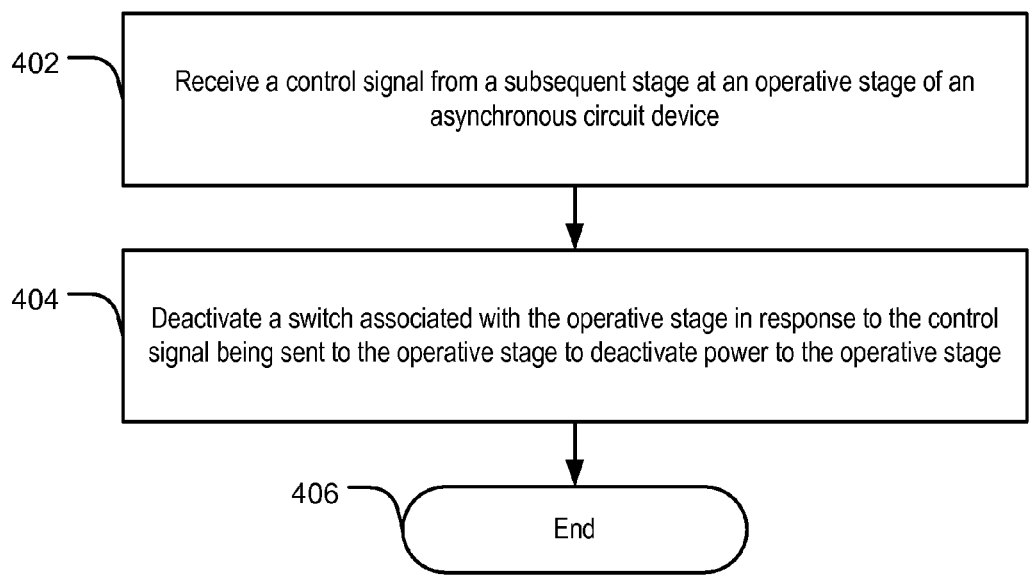
FIG. 4 is a flow diagram of a third illustrative embodiment of a method of leakage control in an asynchronous system.

Referring to FIG. 4, a third illustrative embodiment of a method of leakage control in an asynchronous system is depicted. The method includes receiving a control signal from a subsequent stage at an operative stage of an asynchronous circuit device, at 402. In a particular embodiment, the control signal comprises an acknowledge signal, a data consumed signal, or any combination thereof. In an illustrative embodiment, the control signal may be received at a control logic circuit, such as the acknowledgement signal 284 that is received at the second control logic circuit 270 as illustrated in FIG. 2.

Continuing to 404, a switch associated with the operative stage is deactivated in response to the control signal being sent to the operative stage to deactivate power to the operative stage. The method terminates at 406.

Figure 5:
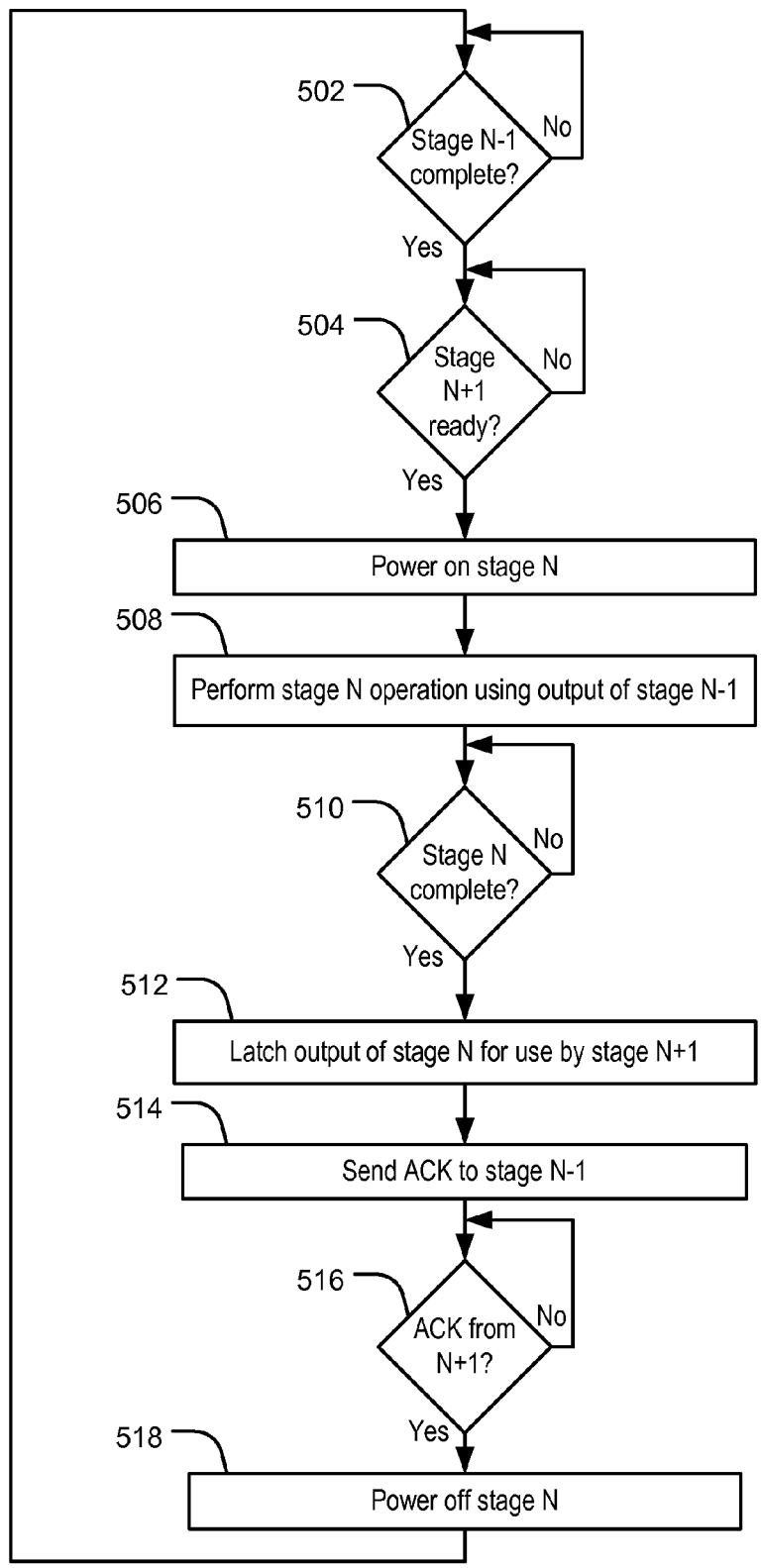
FIG. 5 is a flow diagram of a fourth illustrative embodiment of a method of leakage control in an asynchronous system.

Referring to FIG. 5, a fourth illustrative embodiment of a method of leakage control in an asynchronous system is depicted. The method includes determining, with regard to a current operating stage, if processing at a prior stage (stage N−1) is complete, at 502. In a particular embodiment, the determination is responsive to a data validity or other handshaking signal associated with the prior stage. In an illustrative embodiment, the method may be performed at a controller of an asynchronous data processing pipeline, such as the system 200 illustrated in FIG. 2.

When processing at the prior stage is complete, the method advances to 504, where a determination is made whether a subsequent stage (stage N+1) is ready to receive data. In a particular embodiment, the determination is responsive to an acknowledgement signal or a data consumed signal from the subsequent stage. When the subsequent stage is determined to be ready to receive data from the current operating stage, the method proceeds to 506, where the current operating stage (stage N) undergoes a power-on process. In a particular embodiment, the power on includes activating a head switch or a foot switch. Initiation of the power on may be responsive to a switch activation signal generated in response to handshaking signals, directly responsive to handshaking signals, such as via a transistor receiving handshaking signals at a gate terminal and a body terminal as illustrated in FIG. 2, or any combination thereof.

Continuing to 508, in a particular embodiment, the current stage operation is performed using the output of the prior stage. In another embodiment, at least a portion of the asynchronous system may be stateless, so that the current operating stage performs an operation without receiving data from the prior stage. In yet another embodiment, the current operating stage may receive state information such as outputs from multiple prior stages, in which case the current operating stage may remain powered off until state information is available from the multiple prior stages. Moving to 510, a determination is made if processing at the current operative stage is complete.

When processing at the current operating stage is complete, the method advances to 512, where an output of the current operating stage is latched for use by the subsequent stage. In a particular embodiment, the latched output may be used by multiple subsequent stages, such as when a processing branch occurs. In an alternate embodiment, at least a portion of the asynchronous system may be stateless, so that no state information is latched for use by the subsequent stage.

Proceeding to 514, an acknowledge signal (ACK) is sent to the prior stage, indicating that operation at the current operative stage is complete. In a particular embodiment, the acknowledge signal includes a data consumed signal. Continuing to 516, a determination is made whether an acknowledgement signal (ACK) has been received from the subsequent stage. When an acknowledgement signal is determined to have been received from the subsequent stage, indicating that the subsequent stage no longer requires output data or state information from the current operating stage, the current operating stage is powered off, at 518. The method then returns to 502.

Figure 6:
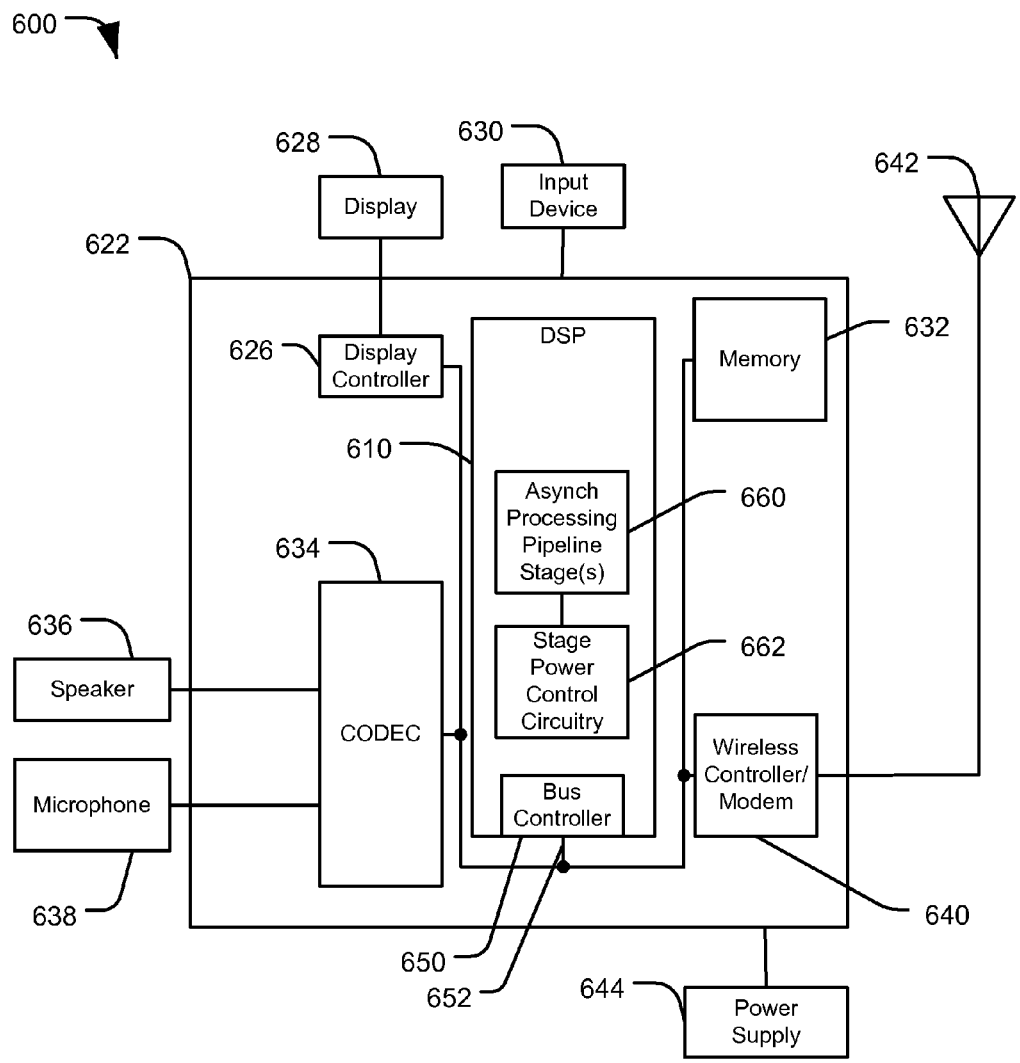
FIG. 6 is a block diagram of a wireless communications device including a system to control leakage in an asynchronous pipeline.

FIG. 6 is a block diagram of an illustrative embodiment of a communications device 600, such as a wireless device, including a system to control leakage in an asynchronous pipeline. The device 600 includes one or more asynchronous processing pipeline stages 660 coupled to stage power control circuitry 662. The stage power control circuitry 662 is configured to selectively couple the one or more asynchronous processing pipeline stages 660 to a power supply in response to a state of the asynchronous pipeline. In a particular embodiment, the asynchronous processing pipeline stages 660 and the stage power control circuitry 662 operate to power off inactive pipeline stages in a manner as described with respect to FIGS. 1-5. In a particular embodiment, the asynchronous processing pipeline stages 660 and the stage power control circuitry 662 are coupled to or integrated within a processor, such as a digital signal processor (DSP) 610. In an illustrative embodiment, the DSP 610 is a pipelined DSP.

FIG. 6 indicates that the DSP 610 includes a bus controller 650 coupled to a bus 652. In a particular embodiment, data is transferred asynchronously via the bus 652. FIG. 6 also shows a display controller 626 that is coupled to the bus 652 and to a display 628. A coder/decoder (CODEC) 634 can also be coupled to the bus 652. A speaker 636 and a microphone 638 can be coupled to the CODEC 634.

FIG. 6 also indicates that a wireless controller and/or modem 640 can be coupled to a wireless antenna 642 and to the bus 652. In a particular embodiment, an input device 630 and a power supply 644 are coupled to the on-chip system 622. Moreover, in a particular embodiment, as illustrated in FIG. 6, the display 628, the input device 630, the speaker 636, the microphone 638, the wireless antenna 642, and the power supply 644 are external to the on-chip system 622. However, each can be coupled to a component of the on-chip system 622, such as an interface or a controller.

Although the asynchronous processing pipeline stages 660 and the stage power control circuitry 662 are depicted as coupled to or integrated with the DSP 610, other components of the communications device 600 may operate as asynchronous processing pipeline stages 660, or may include asynchronous processing pipeline stages 660. For example, an asynchronous pipeline involving wireless speech communication may include all or part of the microphone 638, the CODEC 634, the bus 652, the bus controller 650, the DSP 610, the wireless controller and/or modem 640, or any combination thereof.

In connection with systems and methods described above, a system may include first means to perform a first pipeline operation and second means to asynchronously perform a second pipeline operation sequential to the first pipeline operation. For example, the first means may include the logic circuits, latches, and flip flops described in connection with stages 202, 204, or 206 of FIG. 2, or one or more components of a communications device, such as the microphone 638, the CODEC 634, the bus 652, the bus controller 650, the DSP 610, the wireless controller and/or modem 640, the memory 632, the display controller 626, and the display 628 of the communications device 600 of FIG. 6, or any combination thereof. Similarly, the second means may include the logic circuits, latches, and flip flops described in connection with stages 202, 204, or 206 of FIG. 2, or one or more components of a communications device, such as the microphone 638, the CODEC 634, the bus 652, the bus controller 650, the DSP 610, the wireless controller and/or modem 640, the memory 632, the display controller 626, and the display 628 of the communications device 600 of FIG. 6, or any combination thereof. The system may also include means to selectively decouple the second means from a power supply in response to a state of the first pipeline operation, such as one or more switches, transistors, control logic circuits, stage power control circuitry, or any combination thereof, as depicted in FIGS. 1-6 and as described above.

Those of skill would further appreciate that the various illustrative logical blocks, configurations, modules, circuits, and algorithm steps described in connection with the embodiments disclosed herein may be implemented as electronic hardware, computer software, or combinations of both. To clearly illustrate this interchangeability of hardware and software, various illustrative components, blocks, configurations, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in RAM memory, flash memory, ROM memory, PROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a computing device or a user terminal. In the alternative, the processor and the storage medium may reside as discrete components in a computing device or user terminal.

The previous description of the disclosed embodiments is provided to enable any person skilled in the art to make or use the disclosed embodiments. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope possible consistent with the principles and novel features as defined by the following claims.

What is claimed is:

1. A system comprising:
a first asynchronous logic stage;

a second asynchronous logic stage including a terminal coupled to a power supply or to a ground via a switch, wherein the switch comprises a transistor wherein a control signal is provided to a gate of the transistor, and wherein the transistor is selectively activated in response to the control signal being sent from a preceding asynchronous logic stage to the second asynchronous logic stage to enable power to the second asynchronous logic stage;

a subsequent stage, wherein a body terminal of the transistor is coupled to receive a second control signal from the subsequent stage, wherein a first value of the second control signal causes the transistor to electrically isolate at least a portion of the second asynchronous logic stage from the power supply or from the ground, and wherein a second value of the second control signal causes the transistor to electrically couple the portion of the second asynchronous logic stage to the power supply or to the ground.

2. The system of claim 1, wherein the preceding asynchronous logic stage comprises the first asynchronous logic stage.

3. The system of claim 1, wherein the switch is a head switch or a foot switch.

4. The system of claim 1, wherein the control signal is responsive to a data valid condition that indicates a completion of a data operation at the predecessor asynchronous logic stage.

5. The system of claim 4, wherein the second control signal indicates a ready condition of the subsequent stage to accept data from the second asynchronous logic stage.

6. The system of claim 1, wherein the first asynchronous logic stage, the second asynchronous logic stage, and the subsequent stage are sequential stages of a multistage pipeline.

7. A system comprising:
means for performing a first pipeline operation;
means for asynchronously performing a second pipeline operation sequential to the first pipeline operation;
means for asynchronously performing a third pipeline operation sequential to the second pipeline operation;
means for sending an indication of a state of the second pipeline operation to the means for performing the first pipeline operation;
means for selectively decoupling the means for asynchronously performing the second pipeline operation from a power supply in response to a state of the first pipeline operation after sending the indication of the state of the second pipeline operation, wherein the means for selectively decoupling the means for asynchronously performing the second pipeline operation from a power supply includes:
a switch coupled to the power supply and further coupled to at least one circuit of the means for asynchronously performing the second pipeline operation; and
a first control circuit coupled to the switch and configured to decouple the at least one circuit from the power supply when the first pipeline operation is processing; and
means for sending an acknowledge signal to the first control circuit wherein the means for sending the acknowledge signal to the first control circuit is coupled to the means for asynchronously performing the third pipeline operation and is configured to send the acknowledge signal to the first control circuit when the third pipeline operation is complete, wherein the first control circuit is further configured to decouple the at least one circuit from the power supply in response to the acknowledge signal.

8. A system comprising:
a first processing stage of an asynchronous processing pipeline;
a second processing stage of the asynchronous processing pipeline, wherein the second processing stage is sequential to the first processing stage; and
a control circuit configured to selectively couple the first processing stage to a power supply in response to a first control signal from the second processing stage, wherein the switch comprises a transistor, and wherein the second control signal is provided to a body terminal of the transistor, wherein the first control signal is provided to a gate of the transistor, and
wherein the control circuit is further configured to selectively decouple the first processing stage from the power supply in response to a second control signal from the second processing stage.

9. The system of claim 8, wherein the first processing stage performs a modulation/demodulation (modem) operation.

10. The system of claim 8, wherein the first processing stage performs a coding/decoding (CODEC) operation.

11. The system of claim 8, further comprising a pipelined digital signal processor (DSP), wherein at least a portion of the asynchronous processing pipeline is performed by the pipelined DSP.

12. The system of claim 8, wherein the asynchronous processing pipeline includes an asynchronous data transfer via a bus.

13. A method comprising:
receiving a first control signal from a preceding stage at an operative stage of an asynchronous circuit device;
receiving a second control signal from a subsequent stage at the operative stage of the asynchronous circuit device; and
activating a switch associated with the operative stage in response to the first control signal and the second control signal being received at the operative stage to transition the operative stage from a power-off state to a power-on state, wherein the switch comprises a transistor, and wherein the second control signal is provided to a body terminal of the transistor, wherein the first control signal is provided to a gate of the transistor.

14. The method of claim 13, wherein the first control signal comprises a request signal.

15. The method of claim 13, wherein the first control signal comprises a data validity signal.

16. The method of claim 13, wherein the second control signal indicates a ready condition of the subsequent stage to accept data from the operative stage.

17. The method of claim 16, wherein the asynchronous circuit device includes a processor having a multistage pipeline, and wherein the preceding stage and the operative stage are sequential stages of the multistage pipeline.

18. The method of claim 13, further comprising deactivating the switch to disable power to the operative stage in response to receiving a third control signal at the operative stage from the subsequent stage.

19. The method of claim 18, wherein the third signal indicates a completion of a data operation at the subsequent stage.

20. The method of claim 13, wherein the switch is a head switch or a foot switch.

* * * * *